US010128354B2

(12) United States Patent
Wang et al.

(10) Patent No.: US 10,128,354 B2
(45) Date of Patent: Nov. 13, 2018

(54) THIN FILM TRANSISTOR, METHOD FOR MANUFACTURING THE SAME, ARRAY SUBSTRATE AND DISPLAY DEVICE

(71) Applicant: BOE TECHNOLOGY GROUP CO., LTD., Beijing (CN)

(72) Inventors: Zuqiang Wang, Beijing (CN); Yuqing Yang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/519,948

(22) PCT Filed: Jan. 4, 2016

(86) PCT No.: PCT/CN2016/070007

§ 371 (c)(1),
(2) Date: Apr. 18, 2017

(87) PCT Pub. No.: WO2017/020542

PCT Pub. Date: Feb. 9, 2017

(65) Prior Publication Data

US 2018/0145146 A1    May 24, 2018

(30) Foreign Application Priority Data

Aug. 3, 2015   (CN) .......................... 2015 1 0479312

(51) Int. Cl.
*H01L 29/66* (2006.01)
*H01L 29/786* (2006.01)
(Continued)

(52) U.S. Cl.
CPC .... *H01L 29/6675* (2013.01); *H01L 21/02595* (2013.01); *H01L 21/02675* (2013.01);
(Continued)

(58) Field of Classification Search
None
See application file for complete search history.

(56) References Cited

U.S. PATENT DOCUMENTS 6,677,222 B1    1/2004  Mishima et al.
2006/0276013 A1   12/2006  Chao
(Continued)

FOREIGN PATENT DOCUMENTS

CN    101202218 A    6/2008
CN    101834138 A    9/2010
(Continued)

OTHER PUBLICATIONS

First Office Action for Chinese Application No. 201510479312.X, dated Apr. 1, 2016, 5 Pages.
(Continued)

*Primary Examiner* — Asok K Sarkar
(74) *Attorney, Agent, or Firm* — Brooks Kushman P.C.

(57) ABSTRACT

The present disclosure provides a thin film transistor, a method for manufacturing the same, an array substrate and a display device. The method for manufacturing a thin film transistor includes providing a substrate, forming a gate electrode, a gate insulating layer, an amorphous silicon material active layer and a cap layer on the substrate successively, wherein The cap layer is provided with a pattern on a side of the cap layer away from the amorphous silicon material active layer, and the pattern is composed of at least one groove along a length direction of the active layer and at least one groove along a width direction of the active layer, subjecting the amorphous silicon material active layer to laser annealing treatment to transform the amorphous silicon material active layer into a low temperature polycrystalline silicon material active layer, and removing the cap layer.

20 Claims, 5 Drawing Sheets

(51) Int. Cl.
    *H01L 27/12*     (2006.01)
    *H01L 21/02*     (2006.01)
(52) U.S. Cl.
    CPC ...... *H01L 27/1218* (2013.01); *H01L 27/1274* (2013.01); *H01L 29/786* (2013.01)

(56)           References Cited

U.S. PATENT DOCUMENTS

2009/0127560 A1*  5/2009  Park .................. H01L 21/02532
                                                    257/66
2009/0227076 A1*  9/2009  Miyairi ................ H01L 21/764
                                                    438/151
2015/0194310 A1*  7/2015  Zhang ................. H01L 27/1281
                                                    257/66

FOREIGN PATENT DOCUMENTS

CN          102610520 A      7/2012
CN          103700695 A      4/2014
CN          104538310 A      4/2015
CN          105161498 A      12/2015
JP          2001060551 A     3/2001

OTHER PUBLICATIONS

Second Office Action for Chinese Application No. 201510479312. X, dated Oct. 17, 2016, 5 Pages.
International Search Report and Written Opinion for Application No. PCT/CN2016/070007, dated May 10, 2016, 12 Pages.

* cited by examiner

THIN FILM TRANSISTOR, METHOD FOR MANUFACTURING THE SAME, ARRAY SUBSTRATE AND DISPLAY DEVICE

CROSS-REFERENCE TO RELATED APPLICATION APPLICATIONS

This application is the U.S. national phase of PCT Application No. PCT/CN2016/070007 filed on Jan. 4, 2016, which claims priority to Chinese Patent Application No. 201510479312.X filed on Aug. 3, 2015, the disclosures of which are incorporated in their entirety by reference herein.

TECHNICAL FIELD

The present disclosure relates to the field of display device technology, and more particularly to a thin film transistor, a method for manufacturing the same, an array substrate and a display device.

BACKGROUND

In a manufacturing process of a thin film transistor (TFT), as a material of an active layer in the TFT, a low temperature polysilicon (LTPS) thin film is commonly adopted.

Currently, during a preparation process of the TFT, an excimer laser annealing (ELA) approach is mainly adopted to form the LTPS thin film. The ELA approach mainly performs a laser beam irradiation on amorphous silicon thin film through an excimer laser having certain energy to transform the amorphous silicon into the LTPS at high temperatures using a laser beam energy. However, when the amorphous silicon is irradiated with the laser beam, all regions after irradiating is of a same temperature; therefore, a growth region of a polysilicon grain in the LTPS thin film after crystallization is random. This makes grains in the LTPS thin film be variable in size and of less uniformity, and causes a large amount of crystal boundaries in a TFT channel, which results in a large leakage current of the TFT, and further results in a unstable threshold voltage of the TFT, thus degrading a whole electrical performance of the TFT.

SUMMARY

The present disclosure provides in some embodiments a thin film transistor, a method for manufacturing the same, an array substrate and a display device, so that the TFT may have a good electrical performance. The technical solutions are as follows.

In a first aspect, the present disclosure provides in some embodiments a method for manufacturing a thin film transistor, including: providing a substrate; forming a gate electrode, a gate insulating layer, an amorphous silicon material active layer and a cap layer on the substrate successively, wherein the cap layer is provided with a pattern on a side of the cap layer away from the amorphous silicon material active layer, and the pattern is composed of at least one groove along a length direction of the active layer and at least one groove along a width direction of the active layer; subjecting the amorphous silicon material active layer to laser annealing treatment to transform the amorphous silicon material active layer into a low temperature polycrystalline silicon material active layer; removing the cap layer.

In an implementation of embodiments of the present disclosure, the step of, forming the gate electrode, the gate insulating layer, the amorphous silicon material active layer and the cap layer on the substrate successively includes: forming the gate electrode on the substrate; forming the gate insulating layer on the gate electrode; forming an amorphous silicon material thin film and an oxide thin film on the gate insulating layer successively; and subjecting the amorphous silicon material thin film and the oxide thin film to patterning process treatment to obtain the amorphous silicon material active layer and the cap layer.

In another implementation of embodiments of the present disclosure, the step of, subjecting the amorphous silicon material thin film and the oxide thin film to patterning process treatment comprises: subjecting the amorphous silicon material thin film and the oxide thin film to patterning process treatment using a halftone mask.

In another implementation of embodiments of the present disclosure, the oxide thin film is a silicon dioxide thin film or an indium tin oxide thin film.

In another implementation of embodiments of the present disclosure, a projection of the pattern on the substrate in a perpendicular direction is located at a region corresponding to the gate electrode.

In another implementation of embodiments of the present disclosure, a center of the projection of the pattern on the substrate in the perpendicular direction coincides with a center of a projection of the gate electrode on the substrate in the perpendicular direction.

In another implementation of embodiments of the present disclosure, a thickness of a portion of the cap layer provided with the groove is in the range of 2~5 nanometers, and a thickness of a portion of the cap layer not provided with the groove is in the range of 10~30 nanometers.

In another implementation of embodiments of the present disclosure, the pattern includes at least two grooves along the length direction of the active layer and at least two grooves along the width direction of the active layer, and intersections of the grooves are distributed in a matrix form.

In another implementation of embodiments of the present disclosure, a distance between any two grooves which are adjacent and parallel to each other is in the range of 2~5 micrometers.

In another implementation of embodiments of the present disclosure, the method further includes: before forming the gate electrode, forming a buffer layer on the substrate.

In a second aspect, the present disclosure provides in some embodiments a thin film transistor, including a substrate, and a gate electrode, a gate insulating layer and a low temperature polycrystalline silicon material active layer covering the substrate successively. The low temperature polycrystalline silicon material active layer includes a first region and a second region. The first region is arranged right above the gate electrode in a direction perpendicular to the substrate. The first region is divided into a plurality of first sub-regions by crystal boundaries in the first region. The second region is divided into a plurality of second sub-regions by crystal boundaries in the second region. Each first sub-region is of an area larger than the second sub-region, and the plurality of first sub-regions are distributed in a matrix form.

In a third aspect, the present disclosure provides in some embodiments an array substrate, including the above thin film transistor.

In a fourth aspect, the present disclosure provides in some embodiments a display device, including the above array substrate.

The technical solutions provided by embodiments of the present disclosure have following beneficial effects.

In embodiments of the present disclosure, during the amorphous silicon is crystallized, since a thickness of the cap layer at a patterned portion is thinner, the amorphous silicon material thin film at a corresponding region enters into a fully melted state earlier when under a laser beam irradiation. As a result, a nucleation center is located below a center of a rectangular region formed by the pattern, and the growth direction of the grain is away from the nucleation center, whereupon a crystal boundary is formed below the groove in the pattern. By adopting the above manufacturing method, a number, a direction, a location of crystal boundaries in the polysilicon located below the cap layer in the LTPS thin film may be controlled, thus reducing the number of crystal boundaries in the TFT channel and the leakage current of the TFT, and improving the whole electrical performance of the TFT.

BRIEF DESCRIPTION OF THE DRAWINGS

In order to illustrate technical solutions in embodiments of the present disclosure, drawings to be used in the description of the embodiments will be described briefly hereinafter. Apparently, the drawings described hereinafter are only some embodiments of the present disclosure, and other drawings may be obtained by those skilled in the art according to those drawings without creative work.

DETAILED DESCRIPTION

In order to make the objects, the technical solutions and the advantages of the present disclosure more apparent, the present disclosure will be described hereinafter in a detailed manner in conjunction with the drawings. In drawings, a thickness and a shape of each layer of thin film do not reflect a true scale of the array substrate, which merely aims at exemplarily illustrating contents of the present disclosure.

Unless otherwise defined, any technical or scientific terms used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "connect" or "connected to" may include electrical connection, direct or indirect, rather than being limited to physical or mechanical connection. Such words as "on/above", "under/below", "left" and "right" are merely used to represent relative position relationship, and when an absolute position of an object is changed, the relative position relationship will be changed too.

Figure 1:
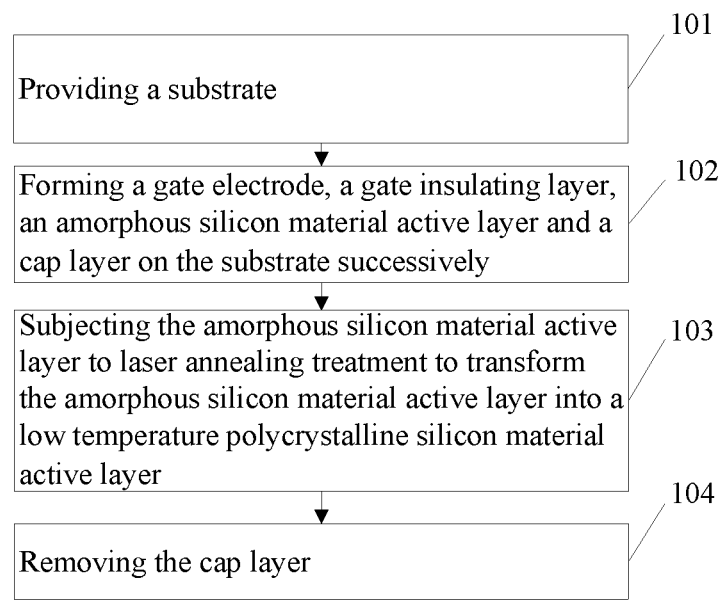
FIG. 1 is a flow chart showing a method for manufacturing a thin film transistor according to some embodiments of the present disclosure.

FIG. 1 is a flow chart showing a method for manufacturing a thin film transistor according to some embodiments of the present disclosure. Referring to FIG. 1, the method includes the following steps.

Step 101: Providing a substrate.

Step 102: Forming a gate electrode, a gate insulating layer, an amorphous silicon material active layer and a cap layer on the substrate successively. The cap layer is provided with a pattern on a side of the cap layer away from the amorphous silicon material active layer, and the pattern is composed of at least one groove along a length direction of the active layer and at least one groove along a width direction of the active layer.

Step 103: Subjecting the amorphous silicon material active layer to laser annealing treatment to transform the amorphous silicon material active layer into a low temperature polycrystalline silicon material active layer.

Step 104: Removing the cap layer.

In embodiments of the present disclosure, when the amorphous silicon is crystallized, since a thickness of the cap layer at a patterned portion is thinner, the amorphous silicon material thin film at a corresponding region enters into a fully melted state earlier when under a laser beam irradiation. As a result, a nucleation center is located below a center of a rectangular region formed by the pattern, and the growth direction of the grain is away from the nucleation center, whereupon a crystal boundary is formed below the groove in the pattern. By adopting the above manufacturing method, a number, a direction, a location of crystal boundaries in the polysilicon located below the cap layer in the LTPS thin film may be controlled, thus reducing the number of crystal boundaries in the TFT channel and the leakage current of the TFT, and improving the whole electrical performance of the TFT.

Figure 2:
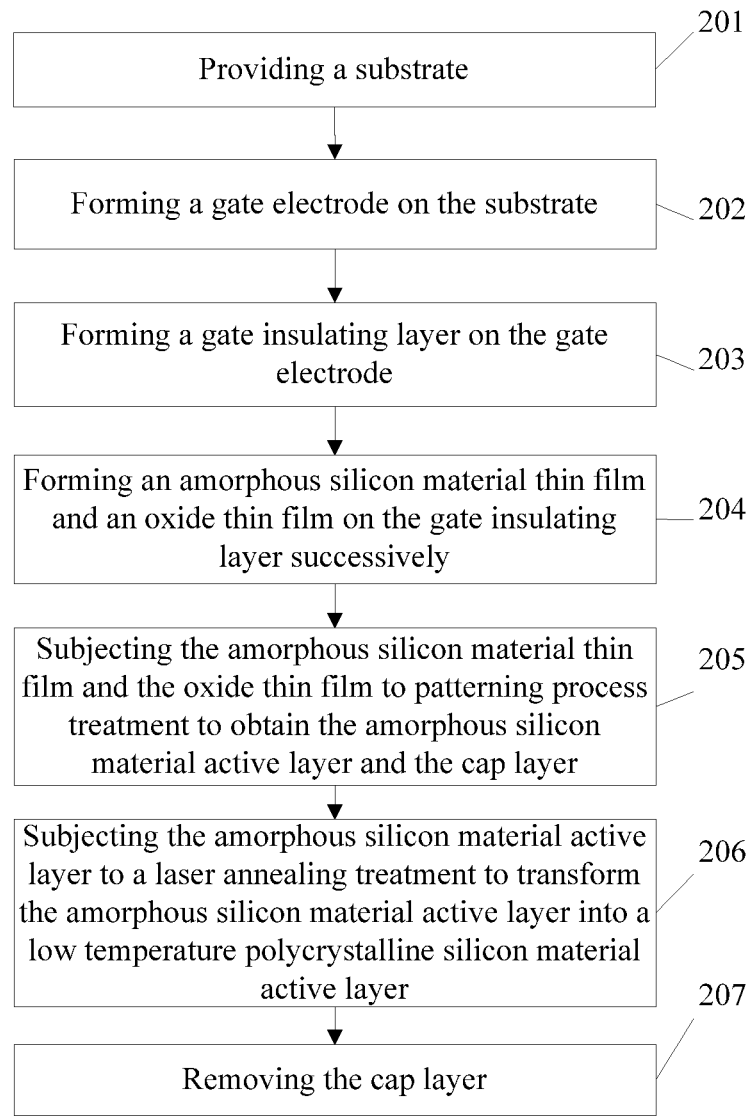
FIG. 2 is a flow chart showing the method for manufacturing a thin film transistor according to some embodiments of the present disclosure.

FIG. 2 is a flow chart showing method for manufacturing a thin film transistor according to some embodiments of the present disclosure. Referring to FIG. 2, the method includes the following steps.

Step 201: Providing a substrate.

The substrate may be a glass substrate, a transparent plastic substrate etc.

Step 202: Forming a gate electrode on the substrate.

Figure 2A:
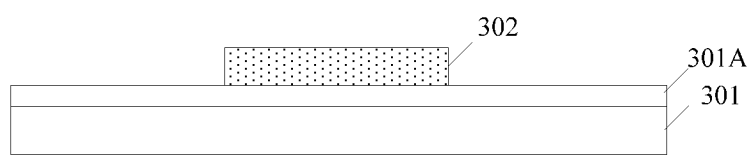
FIG. 2a is a schematic diagram showing a thin film transistor during a manufacturing process according to some embodiments of the present disclosure.

As shown in FIG. 2a, a substrate 301 provided in the step 201 may be covered with a buffer layer 301A in advance, and then a gate electrode 302 is formed. Therefore, the method may further include: prior to forming the gate electrode, forming a buffer layer on the substrate. Specifically, the buffer layer may be a silicon nitride (e.g., SiN) layer or a silicon oxide (e.g., $SiO_2$) layer.

The gate electrode may be a metal gate electrode, and then the forming process of the gate electrode may include: forming a metal layer on the buffer layer first, and then subjecting the metal layer to patterning process treatment to form the above gate electrode.

Step 203: Forming a gate insulating layer on the gate electrode.

Figure 2B:
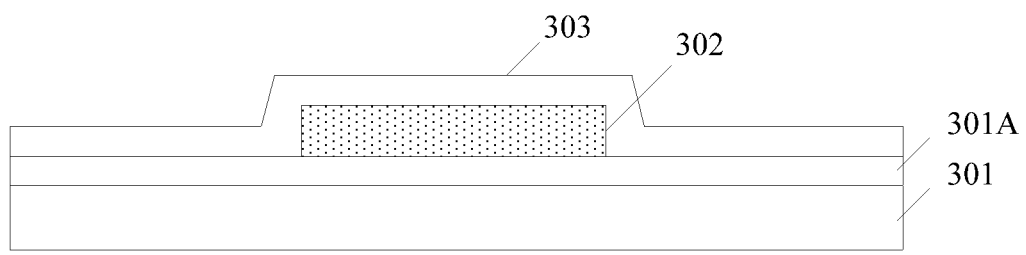
FIG. 2b is a schematic diagram showing a thin film transistor during a manufacturing process according to some embodiments of the present disclosure.

As shown in FIG. 2b, forming a gate insulating layer 303 on the gate electrode 302.

Specifically, the gate insulating layer may be a silicon nitride (e.g., SiN) layer or a silicon oxide (e.g., $SiO_2$) layer.

Step 204: Forming an amorphous silicon material thin film and an oxide thin film on the gate insulating layer successively.

Figure 2C:
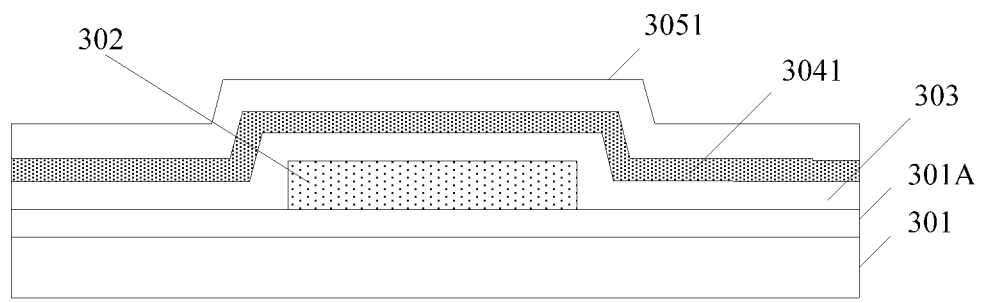
FIG. 2c is a schematic diagram showing a thin film transistor during a manufacturing process according to some embodiments of the present disclosure.

As shown in FIG. 2c, covering the gate insulating layer 303 with an amorphous silicon material thin film 3041 and an oxide thin film 3051.

The oxide thin film is a silicon dioxide thin film, an indium tin oxide (ITO) thin film or other types of oxide thin film.

Step 205: Subjecting the amorphous silicon material thin film and the oxide thin film to patterning process treatment to obtain the amorphous silicon material active layer and the cap layer. The cap layer is provided with a pattern on a side of the cap layer away from the amorphous silicon material active layer, and the pattern is composed of at least one groove along a length direction of the active layer and at least one groove along a width direction of the active layer.

Figure 2D:
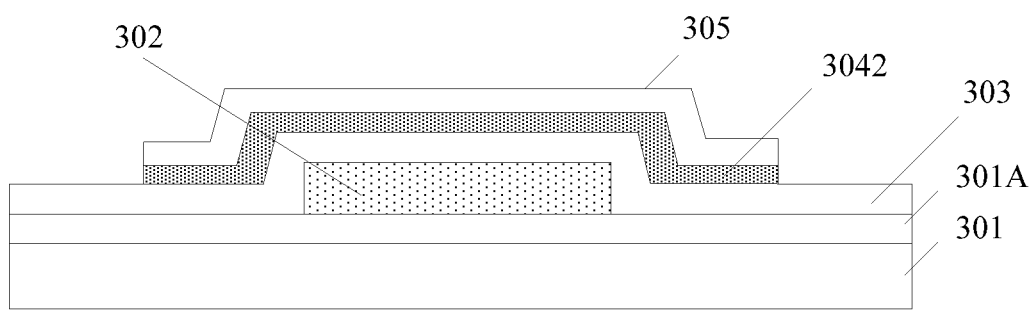
FIG. 2d is a schematic diagram showing a thin film transistor during a manufacturing process according to some embodiments of the present disclosure.

As shown in FIG. 2d, after subjecting the amorphous silicon material thin film 3041 and the oxide thin film 3051 to patterning process treatment, an amorphous silicon material active layer 3042 and a cap layer 305 are formed.

Figure 2E:
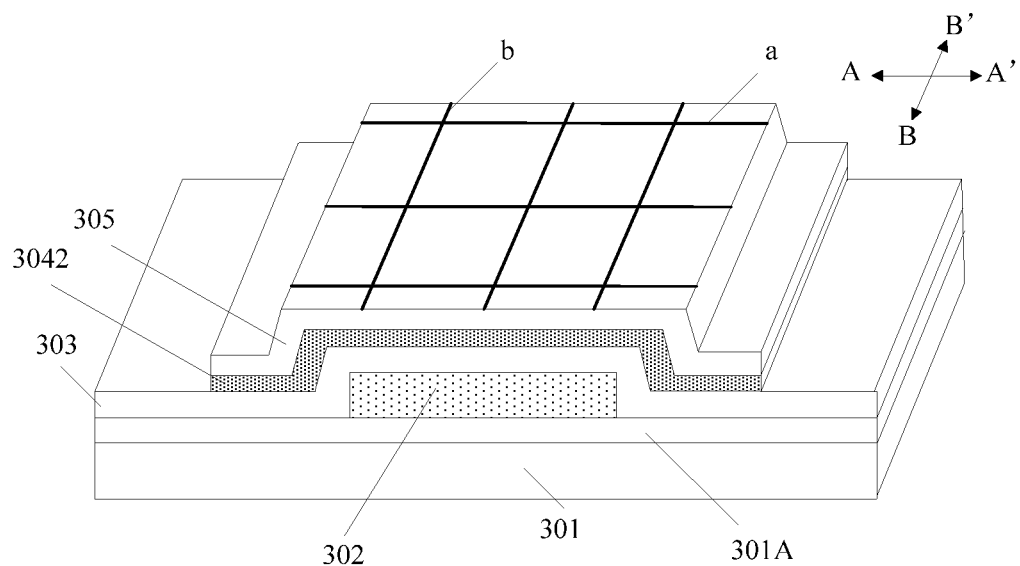
FIG. 2e is a schematic diagram showing a thin film transistor during a manufacturing process according to some embodiments of the present disclosure.

FIG. 2e is a stereo schematic diagram showing the structure shown in FIG. 2d. As shown in FIG. 2e, the pattern is composed of at least one groove a along a length direction of the channel of the active layer (i.e., the AA' direction in the figure) and at least one groove b along a width direction of the channel of the active layer (i.e., the BB' direction in the figure).

In embodiments of the present disclosure, the length direction of the active layer is identical to that of the channel of the TFT when it is turned on, and the width direction of the active layer is identical to that of the channel of the TFT when it is turned on. The length direction of the channel is a direction of current flow in the channel region, and the width direction of the channel is a direction perpendicular to the length direction of the channel in the channel region.

The patterning process in the step 205 may be realized using a mask photo-etching process, therefore the patterning of the cap layer and that of the active layer may be accomplished at one step without any additional etching process. Specifically, the step 205 may include: subjecting the amorphous silicon material thin film and the oxide thin film to patterning process treatment using a halftone mask to obtain an amorphous silicon material active layer and a cap layer.

Specifically, a projection of the pattern on the substrate in a perpendicular direction is located at a region corresponding to the gate electrode. That is, the pattern is corresponding to the channel region. In embodiments of the present disclosure, the whole electrical performance of the TFT may be improved by improving the crystal boundaries in the polysilicon in the channel region of the active layer, and reducing the number of defect states.

Furthermore, a center of the projection of the pattern on the substrate in the perpendicular direction coincides with a center of a projection of the gate electrode on the substrate in the perpendicular direction.

A thickness of a portion of the cap layer provided with the groove is in the range of 2~5 nanometers, and a thickness of a portion of the cap layer not provided with the groove is in the range of 10~30 nanometers. In embodiments of the present disclosure, by setting of thickness of the above cap layer, a temperature difference between the patterned portion and non-patterned portion is assured, which plays a role of induction and guidance for a formation of crystal boundaries.

Specifically, the pattern includes at least two grooves along the length direction of the active layer and at least two grooves along the width direction of the active layer, and intersections of the grooves are distributed in a matrix form.

Furthermore, in embodiments of the present disclosure, the number of grooves in the pattern may be determined according to a width and a length of the channel of the TFT, the larger the width and length of the channel of the TFT, the greater number of grooves in the pattern. A distance between any two grooves which are adjacent and parallel to each other is in the range of 2~5 micrometers.

The distance between grooves in the pattern is configured to define the number and arrangement of the crystal boundaries in the active layer, and an arrangement of the above distance may ensure that the number of crystal boundaries in the channel of the active layer is small.

Step 206: Subjecting the amorphous silicon material active layer to a laser annealing treatment to transform the amorphous silicon material active layer into a low temperature polycrystalline silicon material active layer.

Figure 2F:
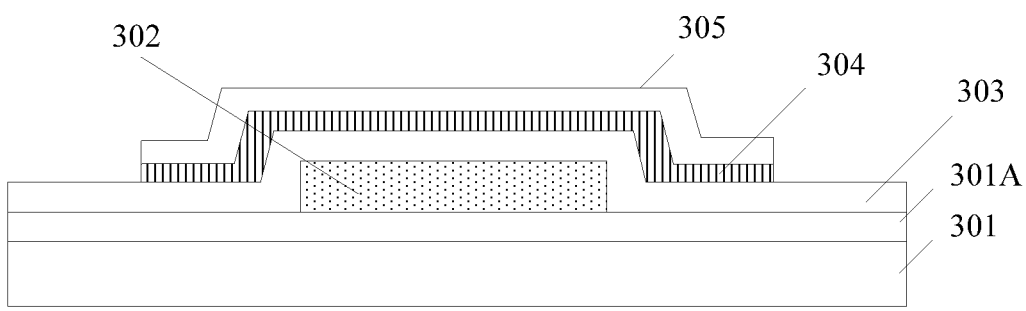
FIG. 2f is a schematic diagram showing a thin film transistor during a manufacturing process according to some embodiments of the present disclosure.

As shown in FIG. 2f, the amorphous silicon material active layer 3042 is melted under the laser beam irradiation and crystallized to form a low temperature polycrystalline silicon material active layer 304.

When the laser beam irradiates the cap layer, the amorphous silicon material is melted and crystallized in a length direction of the channel (the AA' direction in FIG. 2e). At an edge close to the gate electrode, since the amorphous silicon material is relatively thicker at the slope, the amorphous silicon material is partially melted down during ELA irritation. At this moment, a temperature gradient is formed in the AA' direction, therefore the grain growth is progressed towards to the melted portion from the partially melted portion to form a crystal boundary perpendicular to the channel.

Meanwhile, in the width direction of the channel (the BB' direction in FIG. 2e), a cooling speed at the edge of the channel is faster than that at the middle part, therefore there is also a temperature gradient along the BB' direction. As a result, the grain growth is progressed towards to the middle from the edge to form a crystal boundary parallel to the channel direction.

In another aspect, the crystal boundary above the gate electrode is formed under an impact of the pattern of the cap layer. Since the groove portion in the pattern is relatively thin, the amorphous silicon material at the corresponding region enters into a fully melted state first during the crystallization, whereupon the nucleation center is located a center of the region which is divided by the groove, and the growth direction of the grain is away from the nucleation center, therefore a crystal boundary is formed below the groove.

Figure 2G:
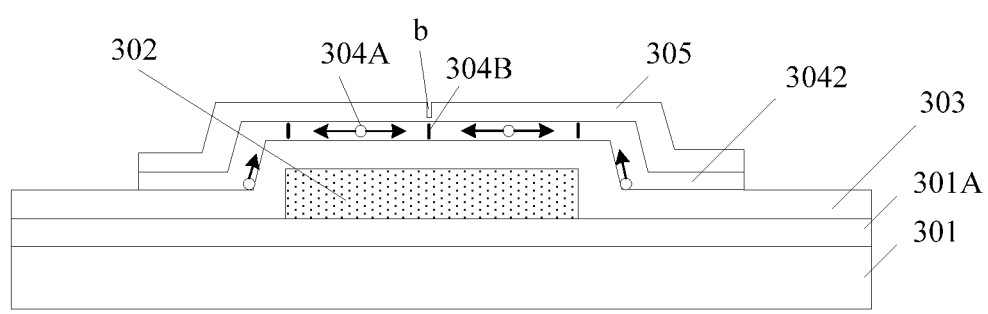
FIG. 2g is a diagram showing a growth direction of a grain according to some embodiments of the present disclosure.

The growth direction of the grain is as shown in FIG. 2g, at the edge close to the gate electrode 302, the growth of grain 304A is progressed towards to the melted portion from the partially melted portion to form a crystal boundary 304B perpendicular to the channel. Moreover, the nucleation center is located in a center of the region divided by the groove b, and the growth direction of the grain 304A is away from the nucleation center, whereupon a crystal boundary 304B is formed below the groove b.

Step 207: Removing the cap layer.

Figure 2H:
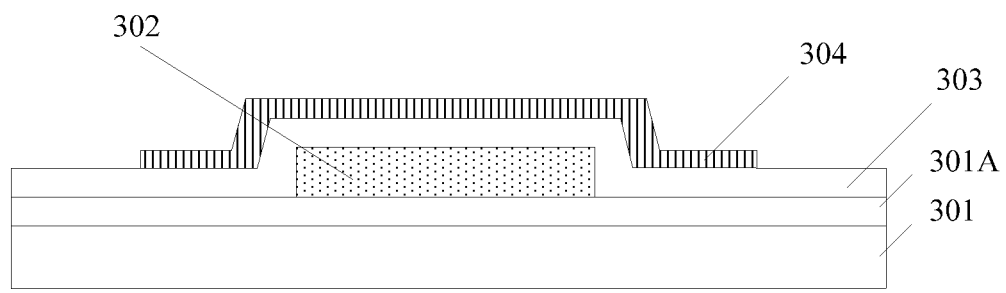
FIG. 2h is a schematic diagram showing a thin film transistor during a manufacturing process according to some embodiments of the present disclosure.

As shown in FIG. 2h, removing the cap layer 305 on the low temperature polycrystalline silicon material active layer 304.

Specifically, in embodiments of the present disclosure, the cap layer may be removed using an etching process.

Furthermore, the method further includes: forming a source electrode and a drain electrode at two opposite sides of the active layer.

In embodiments of the present disclosure, when the amorphous silicon is crystallized, since a thickness of the cap layer at a patterned portion is thinner, the amorphous silicon material thin film at the corresponding region enters into a fully melted state earlier when under a laser beam irradiation. As a result, a nucleation center is located below a center of a rectangular region formed by the pattern, and the growth direction of the grain is away from the nucleation center, whereupon a crystal boundary is formed below the groove in the pattern. By adopting the above manufacturing method, the number, the direction, the location of crystal boundaries in the polysilicon located below the cap layer in the LTPS thin film may be controlled, thus reducing the number of crystal boundaries in the TFT channel and the leakage current of the TFT, and improving the whole electrical performance of the TFT.

The present disclosure provides in some embodiments a thin film transistor, including a substrate, a gate electrode, a gate insulating layer and a low temperature polycrystalline silicon material active layer covering the substrate successively. The low temperature polycrystalline silicon material active layer includes a first region and a second region. The first region is arranged right above the gate electrode in a direction perpendicular to the substrate, the first region is divided into a plurality of first sub-regions by crystal boundaries in the first region. The second region is divided into a plurality of second sub-regions by crystal boundaries in the second region. Each first sub-region is of an area larger than the second sub-region, and the plurality of first sub-regions are distributed in a matrix form.

In embodiments of the present disclosure, the number of first sub-regions in the first region in the active layer is greater than that of the second sub-regions in the second region. Since both the first sub-regions and the second sub-region are divided by crystal boundaries, it can be seen that, crystal boundaries in the first region are less than that in the second region. Here, the first region is arranged right above the gate electrode, that is, the channel region. Therefore the number of crystal boundaries in the channel region in the above structure of the thin film transistor is small, which reduces the leakage current of the TFT, and improves the whole electrical performance of the TFT.

Figure 3:
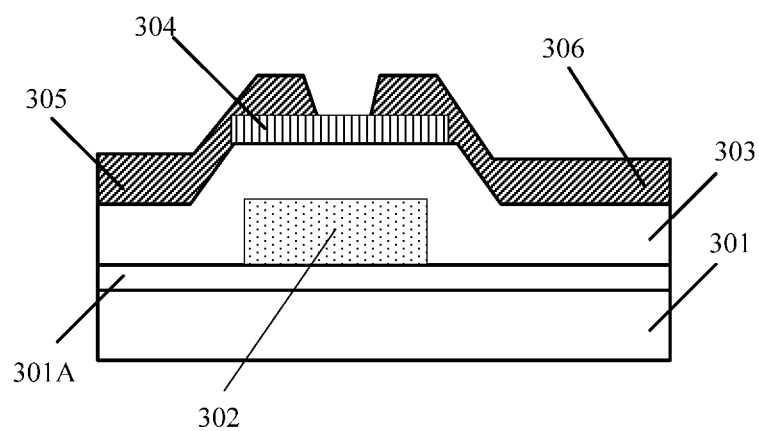
FIG. 3 is a schematic diagram showing a thin film transistor according to some embodiments of the present disclosure.

FIG. 3 is a schematic diagram showing a thin film transistor according to embodiments of the present disclosure. As shown in FIG. 3, the thin film transistor is formed using the method shown in FIG. 2, specifically including: a substrate 301, a buffer layer 301A arranged on substrate 301, a gate electrode 302 arranged on the buffer layer 301A, a gate insulating layer 303 arranged on the gate electrode 302, an active layer 304 arranged on the gate insulating layer 303, a source electrode 305 and a drain electrode 306 which are arranged at two opposite sides of the active layer 304 respectively and in contact with the active layer 304. The active layer 304 is a low temperature polycrystalline silicon material active layer. The low temperature polycrystalline silicon material active layer 304 includes a first region and a second region. The first region is arranged right above the gate electrode 302, the first region is divided into a plurality of first sub-regions by crystal boundaries in the first region. The second region is divided into a plurality of second sub-regions by crystal boundaries in the second region. Each first sub-region is of an area larger than the second sub-region, and the plurality of first sub-regions are distributed in a matrix form.

In embodiments of the present disclosure, the number of first sub-regions in the first region of the active layer is greater than that of the second sub-regions in the second region. Since both the first sub-regions and the second sub-region are divided by crystal boundaries, it can be seen that, crystal boundaries in the first region are less than that in the second region. Here, the first region is arranged right above the gate electrode, that is, the channel region. Therefore the number of crystal boundaries in the channel region in the above structure of the thin film transistor is small, which reduces the leakage current of the TFT, and improves the whole electrical performance of the TFT.

The present disclosure further provides in some embodiments an array substrate. The array substrate includes the thin film transistor according to any one of the above embodiments. Specifically, the array substrate further includes a gate line arranged on the substrate, a data line and a pixel electrode layer and the like. Here, a drain electrode of the thin film transistor is connected to the pixel electrode layer, a gate electrode of the thin film transistor is connected to the gate line, and a source electrode of the thin film transistor is connected to the data line.

The pixel electrode layer may be a transparent conductive metal oxide layer, such as an ITO layer, an indium zinc oxide (IZO) layer.

On the basis of the similar inventive concept, the present disclosure further provides in some embodiments a display device, including the array substrate according to above embodiments.

When specifically implementing, the display device according to embodiments of the present disclosure may be any product or component with display function, such as a mobile phone, a tablet PC, a TV set, a monitor, a notebook computer, a digital photo frame, a navigator.

The above are merely the preferred embodiments of the present disclosure and shall not be used to limit the scope of the present disclosure. It should be noted that, a person skilled in the art may make improvements and modifications without departing from the principle of the present disclosure, and these improvements and modifications shall also fall within the scope of the present disclosure.

What is claimed is:

1. A method for manufacturing a thin film transistor, comprising:
   providing a substrate;
   forming a gate electrode, a gate insulating layer, an amorphous silicon material active layer and a cap layer on the substrate successively, wherein the cap layer is provided with a pattern on a side of the cap layer away from the amorphous silicon material active layer, and the pattern is composed of at least one straight groove extending to two edges of the active layer along a length direction of the active layer and at least one straight groove extending to the other two edges of the active layer along a width direction of the active layer;

subjecting the amorphous silicon material active layer to laser annealing treatment to transform the amorphous silicon material active layer into a low temperature polycrystalline silicon material active layer; and removing the cap layer.

2. The method according to claim 1, wherein the step of, forming the gate electrode, the gate insulating layer, the amorphous silicon material active layer and the cap layer on the substrate successively comprises:

forming the gate electrode on the substrate;

forming the gate insulating layer on the gate electrode;

forming an amorphous silicon material thin film and an oxide thin film on the gate insulating layer successively; and subjecting the amorphous silicon material thin film and the oxide thin film to patterning process treatment to obtain the amorphous silicon material active layer and the cap layer.

3. The method according to claim 2, wherein the oxide thin film is a silicon dioxide thin film or an indium tin oxide thin film.

4. The method according to claim 2, wherein a projection of the pattern on the substrate in a perpendicular direction is located at a region corresponding to the gate electrode.

5. The method according to claim 2, wherein a thickness of a portion of the cap layer provided with the groove is in the range of 2~5 nanometers, and a thickness of a portion of the cap layer not provided with the groove is in the range of 10~30 nanometers.

6. The method according to claim 2, wherein the pattern comprises at least two grooves along the length direction of the active layer and at least two grooves along the width direction of the active layer, and intersections of the grooves are distributed in a matrix form.

7. The method according to claim 2, wherein the step of, subjecting the amorphous silicon material thin film and the oxide thin film to patterning process treatment comprises:

subjecting the amorphous silicon material thin film and the oxide thin film to patterning process treatment using a halftone mask.

8. The method according to claim 7, wherein a projection of the pattern on the substrate in a perpendicular direction is located at a region corresponding to the gate electrode.

9. The method according to claim 7, wherein a thickness of a portion of the cap layer provided with the groove is in the range of 2~5 nanometers, and a thickness of a portion of the cap layer not provided with the groove is in the range of 10~30 nanometers.

10. The method according to claim 7, wherein the pattern comprises at least two grooves along the length direction of the active layer and at least two grooves along the width direction of the active layer, and intersections of the grooves are distributed in a matrix form.

11. The method according to claim 1, wherein a projection of the pattern on the substrate in a perpendicular direction is located at a region corresponding to the gate electrode.

12. The method according to claim 11, wherein a center of the projection of the pattern on the substrate in the perpendicular direction coincides with a center of a projection of the gate electrode on the substrate in the perpendicular direction.

13. The method according to claim 1, wherein a thickness of a portion of the cap layer provided with the groove is in the range of 2~5 nanometers, and a thickness of a portion of the cap layer not provided with the groove is in the range of 10~30 nanometers.

14. The method according to claim 1, wherein the pattern comprises at least two grooves along the length direction of the active layer and at least two grooves along the width direction of the active layer, and intersections of the grooves are distributed in a matrix form.

15. The method according to claim 14, wherein a distance between any two grooves which are adjacent and parallel to each other is in the range of 2~5 micrometers.

16. The method according to claim 1, further comprising:

before forming the gate electrode, forming a buffer layer on the substrate.

17. The method according to claim 1, wherein the step of subjecting the amorphous silicon material active layer to laser annealing treatment to transform the amorphous silicon material active layer into a low temperature polycrystalline silicon material active layer comprising:

growing grains of the low temperature polycrystalline silicon material active layer and forming crystal boundaries of the grains under the straight grooves.

18. A thin film transistor, comprising a substrate, and a gate electrode, a gate insulating layer and a low temperature polycrystalline silicon material active layer covering the substrate successively, wherein the low temperature polycrystalline silicon material active layer comprises a first region and a second region, the first region is arranged right above the gate electrode in a direction perpendicular to the substrate, the first region is divided into a plurality of first sub-regions by crystal boundaries under straight lines in the first region, wherein at least one straight line of the straight lines extends to two edges of the active layer along a length direction of the active layer, and at least one straight line of the straight lines extends to the other two edges of the active layer along a width direction of the active layer, the second region is divided into a plurality of second sub-regions by crystal boundaries in the second region, each first sub-region is of an area larger than the second sub-region, and the plurality of first sub-regions is distributed in a matrix form.

19. An array substrate, comprising the thin film transistor according to claim 18.

20. A display device, comprising the array substrate according to claim 19.

* * * * *